United States Patent
Wang et al.

(10) Patent No.: US 6,586,972 B2
(45) Date of Patent: Jul. 1, 2003

(54) TRANSISTOR-MISMATCH-INSENSITIVE CURRENT COMPARATOR CELL

(75) Inventors: Chunyan Wang, Montreal (CA); Omair M. Ahmad, Montreal (CA); M. N. Srikanta Swamy, St-Lambert (CA)

(73) Assignee: Valorbec, Limited Partnership, Montreal (CA)

( * ) Notice: Subject to any disclaimer, the term of this patent is extended or adjusted under 35 U.S.C. 154(b) by 0 days.

(21) Appl. No.: 09/794,223

(22) Filed: Feb. 28, 2001

(65) Prior Publication Data

US 2001/0035777 A1 Nov. 1, 2001

Related U.S. Application Data

(60) Provisional application No. 60/185,498, filed on Feb. 28, 2000.

(51) Int. Cl.$^7$ .................................................. H03K 5/22
(52) U.S. Cl. ........................................ 327/87; 327/103
(58) Field of Search .................... 327/77, 87, 538–541, 327/103

(56) References Cited

U.S. PATENT DOCUMENTS 6,087,873 A * 7/2000 Alexander .................... 327/74

OTHER PUBLICATIONS

Z. Wang and Guggenbühl, "Novel CMOS current Schmitt trigger," *Electronics Letters,* vol. 24, No. 24, Nov. 1998, pp. 1514–1516.
H. Träff, "Novel approach to high speed CMOS current comparators," *Electronics Letters,* vol. 28, No. 3, Jan. 1991, pp. 310–312.
A.T.K. Tang and C. Toumazou. "High performance CMOS current comparator," *Electronics Letters,* vol. 30, No. 1, Jan. 1994, pp. 5–6.
G. Linàn–Cembrano et al. "A robust high–accuracy high–speed continuous–time CMOS current comparator," *Electronics Letters,* vol. 33, Dec. 1997, pp. 2082–2084.
A. Worapishet et al. "Enhanced switched–current comparator," *Electronics Letters,* vol. 35, No. 10, May 1999, pp. 767–768.
Freitas and K. Current. "A CMOS current comparator circuit," *Electronics Letters,* vol. 19, No. 17, Aug. 1983, pp. 694–697.
F. Forti and M.E. Wright. "Measurement of MOS current mismatch in the weak inversion region," *IEEE J. Solid State Ciruits,* vol. 29, No. 2, Feb. 1994, pp. 138–142.
C.A. Mead. "Adaptive retina," *Analog VLSI Implementation of Neural Systems,* C. Mead and M. Ismail, Eds., Chapter 10, Kluwer Academic Publishers, 1989,pp. 239–246.
F. Lavainne, Y. Ni., P. de Carné, F. Devos. "An analog adaptive smart image sensor for spatio–temporal information extraction," *Proc. of ISPRS Intercommission Workshop "From pixels to Sequences,"* Zurich, Mar. 1995, pp. 259–264.
K.R. Stafford, R.A. Blanchard and P.R. Gray. "A completely monolithic sample/hold amplifier using compatible bipolar and silicon–gate FET devices," *IEEE J. Solid State Circuits,* vol. SC–9, Dec. 1974, pp. 381–387.

* cited by examiner

*Primary Examiner*—Kenneth B. Wells
(74) *Attorney, Agent, or Firm*—James Anglehart; Ogilvy Renault

(57) ABSTRACT

This invention relates to a method and apparatus for converting a current signal into a two-level output voltage depending on a reference current signal. In one embodiment, a first current, which is the reference current signal is applied to the apparatus. A negative feedback sets the output of the apparatus in a certain configuration. Any current signal to be compared to the reference current signal may be then applied. The output voltage level depends on whether the current signal is lower or higher than the reference current signal.

12 Claims, 7 Drawing Sheets

TRANSISTOR-MISMATCH-INSENSITIVE CURRENT COMPARATOR CELL

The present application claims priority of U.S. provisional patent application 60/185,498 filed Feb 28, 2000.

FIELD OF THE INVENTION

The present invention relates to a method and apparatus for converting current signal to two voltage level conversion through an adaptive thresholding.

BACKGROUND OF THE INVENTION

Current comparators are important building blocks in the design of optical signal processing, electronic signal processing and data conversion circuits, In many of the existing analog current comparators, the input current is first converted into a voltage signal. This voltage signal is then compared to a voltage threshold and the output is a two level voltage signal. The current-to-voltage conversion scheme is either performed using a process of charge accumulation or using resistive device. The use of a resistive device may cause serious accuracy problems due to transistor mismatch while the use of charge accumulation requires linear capacitors and introduces delays. For voltage comparators, transistor mismatch is unavoidable causing threshold shifting. Moreover, many voltage comparators are op-amp-based, which may not be silicon-space-efficient.

Some current detection circuits based on MOS transistor features have been reported in the literature; for instance, the current Schmitt-trigger (Z. Wang and Guggenbühl. "Novel CMOS current Schmitt trigger." Electronics Letters, vol. 24, No 24, November 1988, pp. 1514–1516), current detectors with feedback structures (H. Träff. "Novel approach to high speed CMOS current comparators," Electronics Letters, vol. 28, No3, January 1992, pp. 310–312; A. T. K. Tang and C. Toumazou. "High performance CMOS current comparator," Electronics Letters, vol. 30, No.1, January 1994, pp. 5–6; G. Linàn-Cembrano et al. "A robust high-accuracy high-speed continuous-time CMOS current comparator," Electronics Letters, vol.33, December 1997, pp.2082–2084.), and switched-current comparators (A. Worapishet et al. "Enhanced switched-current comparator," Electronics Letters, vol.35, No.10, May 1999, pp. 767–768). These circuits produce a two level output voltage according to the polarity of the input current, instead of performing a current comparison with a specified value of the threshold.

Mead (C. A. Mead "Adaptive retina," Analog VLSI Implementation of Neural Systems, C. Mead and M. Ismail, Eds., chapter 10, Kluwer Academic Publishers, 1989, pp.239–246) proposed an adaptive retina in order to cope with the transistor mismatch issue. The adaptive retina, uses floating gates to correct the transistor parameter dispersion. Unfortunately, this solution requires a double-poly technology for circuit implementation, thus making it incompatible with the present digital implementation technology using a single-poly process.

Lavainne et al (F. Lavainne, Y.Ni, P. de Carné, F. Devos "An analog adaptive smart image sensor for spatio-temporal information extraction," Proc. of ISPRS Intercommission Workshop "From pixels to Sequences", Zurich, March, 1995, pp. 259–264) have proposed an adaptive process to make a uniform performance of the photocurrent comparator cell in a 2D optical sensor matrix. The comparator uses a classical capacitive current-voltage converter cascaded with an op-amp based voltage comparator and combined with a feedback circuit to carry out the adaptive compensation. Unfortunately, such circuit has the disadvantage that the speed of the circuit is limited by the charge accumulation process, multiple clocks are needed to process control, and a large silicon space is required to accommodate the large number of devices including a linear capacitor needed for the circuit.

There is a need to develop a current comparator which converts a current into a two-level voltage.

SUMMARY OF THE INVENTION

It is an object of the present invention to provide a method and apparatus for converting a current signal into a two-level voltage signal depending on the value of the current signal.

It is an object of the present invention to provide a method and apparatus for converting a current signal into a two-level voltage signal depending on the value of the current signal, which method and apparatus is insensitive to transistor mismatch.

It is another object of the present invention to provide a method and apparatus for converting a current signal into a two-level voltage signal depending on the value of the current signal, which works with low current e.g. nano Ampere range.

It is another object of the present invention to provide a method and apparatus for converting a current signal into a two-level voltage signal depending on the value of the current signal, which is insensitive to transistor mismatch and which does not introduce significant delays.

It is another object of the present invention to provide a method and an apparatus for converting a current signal into a two-level voltage signal depending on the value of the current signal which operates with a threshold variation of about 1% or less.

It is another object of the present invention to provide a method and apparatus for converting a current signal into a two-level voltage signal depending on the value of the current signal wherein the width of the transition region of the transfer characteristic is tuneable.

According to one aspect of the invention, there is provided a method for converting an input current signal into a two-level output voltage signal depending on a threshold current signal value and using a transistor, the method comprising the steps of receiving the threshold current signal value, memorizing the threshold value by setting up the transistor in a configuration wherein the output voltage has a certain value; receiving the input current signal to be compared to the threshold current signal value; comparing the input current signal to the threshold current signal value; outputting a two-level output voltage signal depending on the input current signal value and the threshold current signal value.

According to another aspect of the invention there is provided an apparatus for converting an input current signal into a two-level output voltage signal depending on a threshold current signal value, the converter comprising a first circuit for converting the input current signal into the output voltage signal, the first circuit comprising an output transistor, the output transistor providing the output voltage signal, a voltage to current converter, the voltage to current converter receiving a controlled voltage and providing a feedback current signal to the output transistor of the first circuit, the feedback current signal entering the output transistor and modifying the output voltage signal to be equal to an intermediary voltage corresponding to a threshold current generating the controlled voltage signal during a set-up, a set-up switch receiving the output voltage signal and providing the controlled voltage signal, wherein the switch enables a setup of the threshold current signal value with a specific input current signal value when the transistor is closed.

BRIEF DESCRIPTION OF THE DRAWINGS

The invention will be better understood by way of the following detailed description of a preferred embodiment with reference to the appended drawings, in which.

DETAILED DESCRIPTION OF THE PREFERRED EMBODIMENT

Figure 1A:
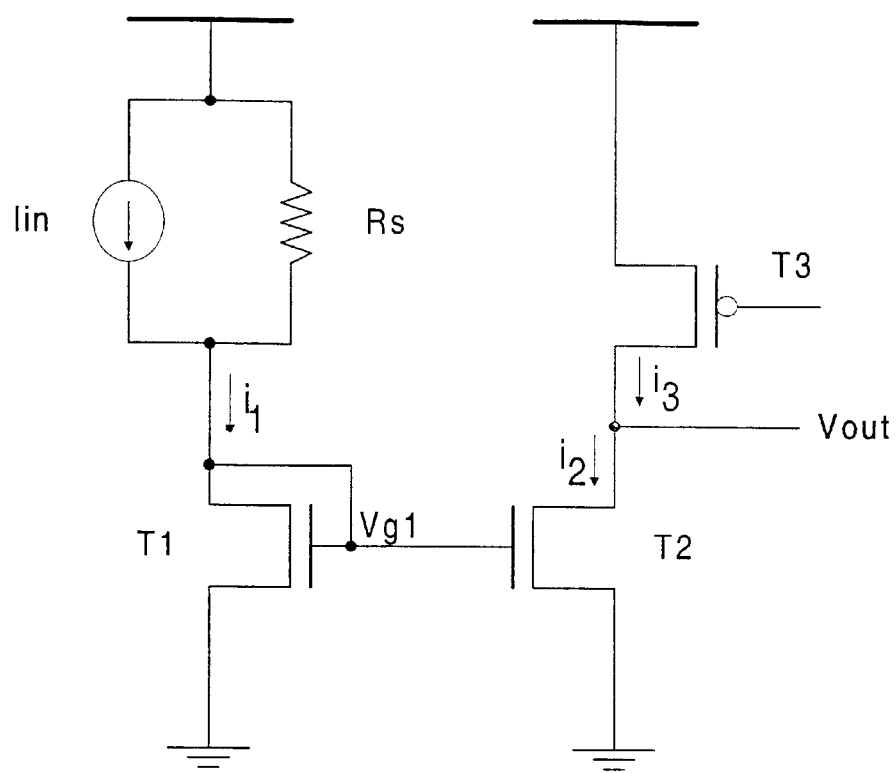
FIG. 1a is a circuit schematic of an apparatus for converting a current signal into a two voltage level signal.

Now referring to FIG. 1a, there is shown one simple current comparator proposed by Freitas and Current (Freitas and K. Current, "A CMOS current comparator circuit," Electronics Letters, vol. 19, No. 17, Aug. 1983, pp. 694–697), the converter converts in a single step and with a predetermined current threshold a current $i_{IN}$ into a two-level voltage $V_{OUT}$. The threshold current $i_{TH}$ is set up by applying a voltage $V_{G3}$ at the gate of the transistor $T_3$ of FIG. 1a. For the sake of clarity, transistor $T_1$ and transistor $T_2$ are considered to be identical. Therefore, transistor $T_1$ and transistor $T_2$ create a basic current source; current $i_1$ is equal to current $i_2$. If the current $i_1$ is equal to current $i_3$, transistors $T_2$ and $T_3$ are in a saturation mode, the output voltage is therefore approximately $V_{DD}/2$. If the current $i_1$ is larger than $i_{TH}$, transistor $T_2$ is in the triode mode and transistor $T_3$ is in the saturation mode; the output voltage is set at a low level ($V_{OL}$). Finally, if the threshold current $i_{TH}$ is larger than the current $i_1$, transistor $T_2$ is in the saturation mode, transistor $T_3$ is in the triode mode; the output voltage is set at a high level ($V_{OH}$).

Figure 1B:
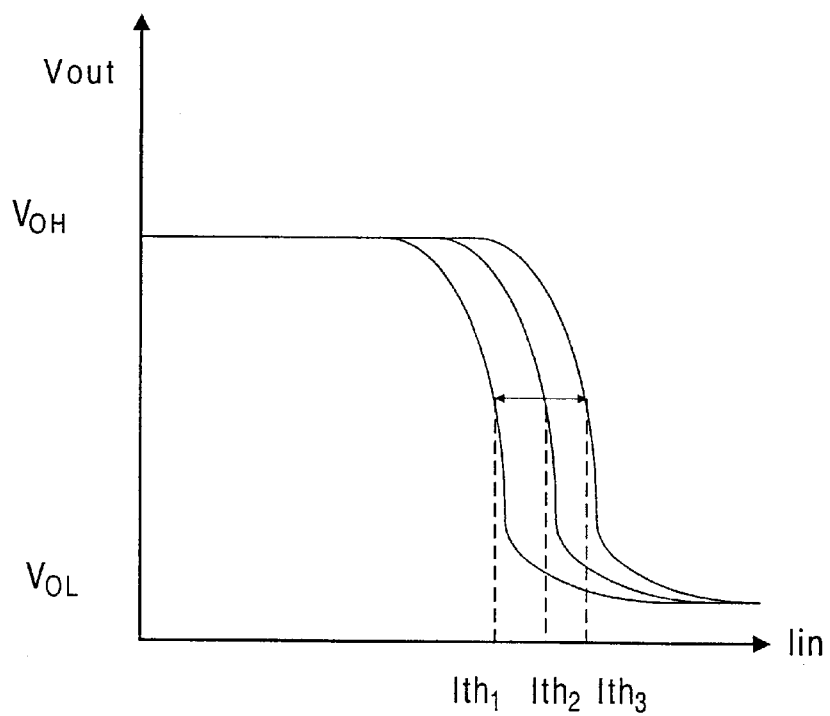
FIG. 1b is a graph which shows the output voltage versus the input voltage of three apparatus which are designed identically and each of which converts a current signal into a two level voltage signal with a threshold non-identical to that of the others due to the non-identical physical parameters of the devices employed.

Unfortunately, this comparator does not meet the requirement of an accurate analog low-level current comparison due to the problem of transistor mismatch, i.e. the physical parameters of identically designed transistor devices being different. If identically designed current comparator cells are fabricated in different places on a semiconductor base, the transistor mismatch may cause a deviation in the threshold of the comparison; as the transconductance of transistor $T_3$ is different for each cell. Applying the same voltage $V_{G3}$ at the gate of transistor $T_3$ results in different threshold currents $i_{TH}$; Also, the transistor mismatch may cause the current transfer ratio $i_2/i_1$ to be significantly different for each cell and the predetermined threshold current is in fact compared to $i_2$ instead of $i_1$, which causes another threshold deviation; furthermore, the ratio $i_1/i_{IN}$ may be significantly different as for each cell, the input current source has a resistance $R_S$ which may be different from that of the others. All these contribute to a significant discrepancy of comparison threshold. FIG. 1b shows such a discrepancy in the transfer characteristics of three such identically designed cells. It is known that the current mismatch between any two transistors of small geometry may be as much as 20% in the weak inversion region (F. Forti and M. E. Wright. "Measurement of MOS current mismatch in the weak inversion region," IEEE J. Solid State Circuits, Vol. 29, No, 2, February 1994, pp. 138–142). Taking all factors into consideration. A threshold variation of up to 50% in identically designed current comparator cells may be expected. If the comparator is intended to be used in an A/D converter or in an optical sensor matrix, wherein the threshold must be substantially the same, extra threshold current set-up is necessary, Now referring to FIG. 2, there is shown one embodiment of the present invention, according to step 20, the adaptive compensation comprises a set-up step wherein the apparatus is set-up. In the preferred embodiment of the present invention, the switch K is closed during the set-up step. According to step 22, the configuration performed during the set-up step 20 is memorized. According to step 24, a current to be compared to a threshold current value is applied. In the preferred embodiment of the present invention, the switch K is opened when a current to be compared is applied. According to step 26, an output is generated according to the comparison results.

Figure 3:
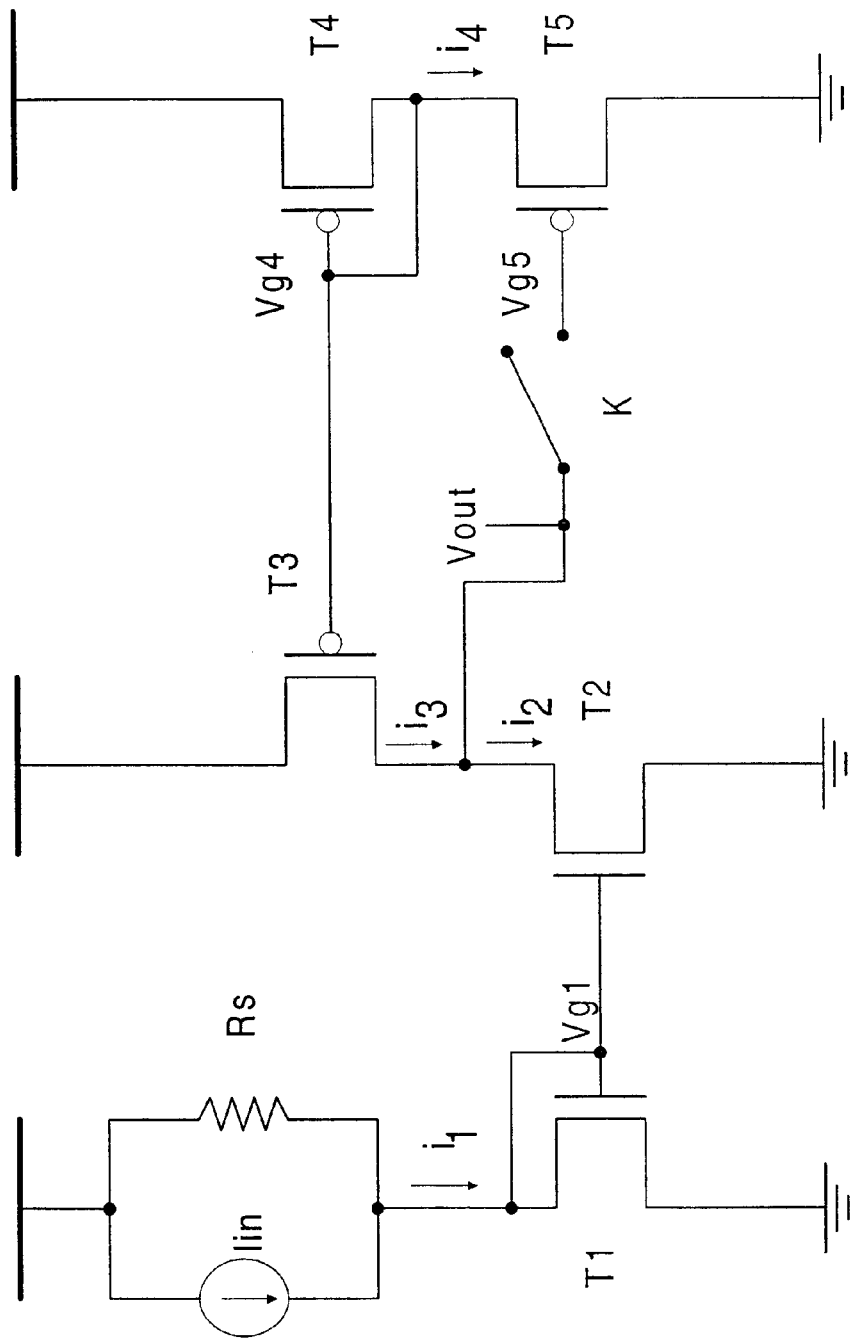
FIG. 3 is an electrical circuit schematic of one embodiment of the present invention.

Now referring to FIG. 3, there is shown one embodiment of the present invention. In this embodiment of the invention, a current to a two level voltage converter is shown. This current to a two level voltage converter comprises the converter described in FIG. 1. A switch K and two transistors are further used to implement a special adaptive procedure.

Figure 2:
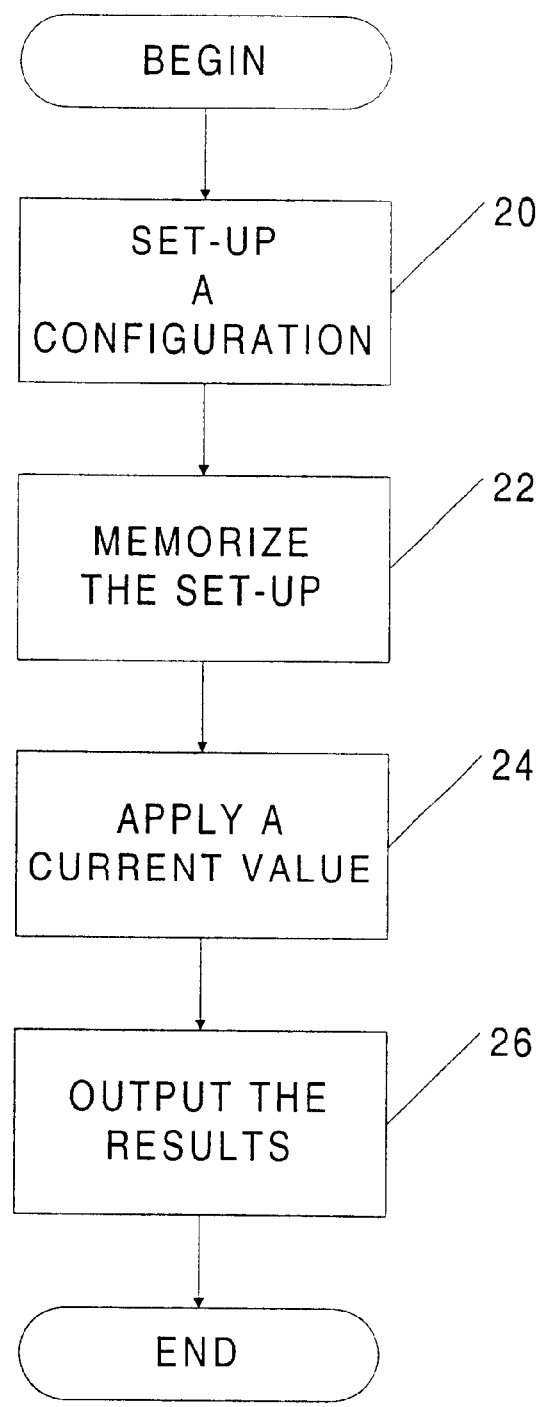
FIG. 2 is a block diagram which shows the steps achieved in one embodiment of the invention.

According to step 20 of FIG. 2, the information of the threshold is collected by injecting one of the two currents to be compared at the input and memorized by turning on the switch K to close the loop formed by the transistors $T_2$–$T_5$. The gate voltages $V_{G3}$ and $V_{G4}$ are then set-up and the current flowing through $T_3$ is established according the input current An equilibrium is obtained and transistors $T_2$ and $T_3$ are working in the saturation region. The equilibrium is created, in this embodiment, by a negative voltage-based feedback. As the equilibrium is reached, the switch K may be turned off according to step 24 of FIG. 2. In the preferred embodiment of the present invention, the set-up time is about 2 ns for a current of 1 nA and for a submicron CMOS.

The apparatus may now work with the other current to be compared if the input current $i_{IN}$ is smaller than the first current, $T_3$ will be in the triode region while $T_2$ is in the saturation region; the output is at a high level $V_{OH}$. If the input current is larger than the threshold current, $T_3$ is in the saturation region, while $T_2$ is in the triode region; the output is at a low level $V_{OL}$. If a circuit comprises several such current comparator cells, a single current source has to be applied to each cell for the threshold current set-up. Thus, all cells will be set-up with the same current source, despite the non-uniformity of the transistor parameters of the cells, The operation performed, in one embodiment of the present invention, is based on the transistor nominal characteristics, however, it is insensitive to the effect of the transistor mismatch. Since the transistor size ratio does not affect the operation accuracy, the designer is free to select a design that will optimize a specific aspect such as speed or power dissipation for instance. Furthermore, as the circuit operation does not involve any charge accumulation, no linear capacitor is required and no significant delay is therefore introduced.

Figure 4:
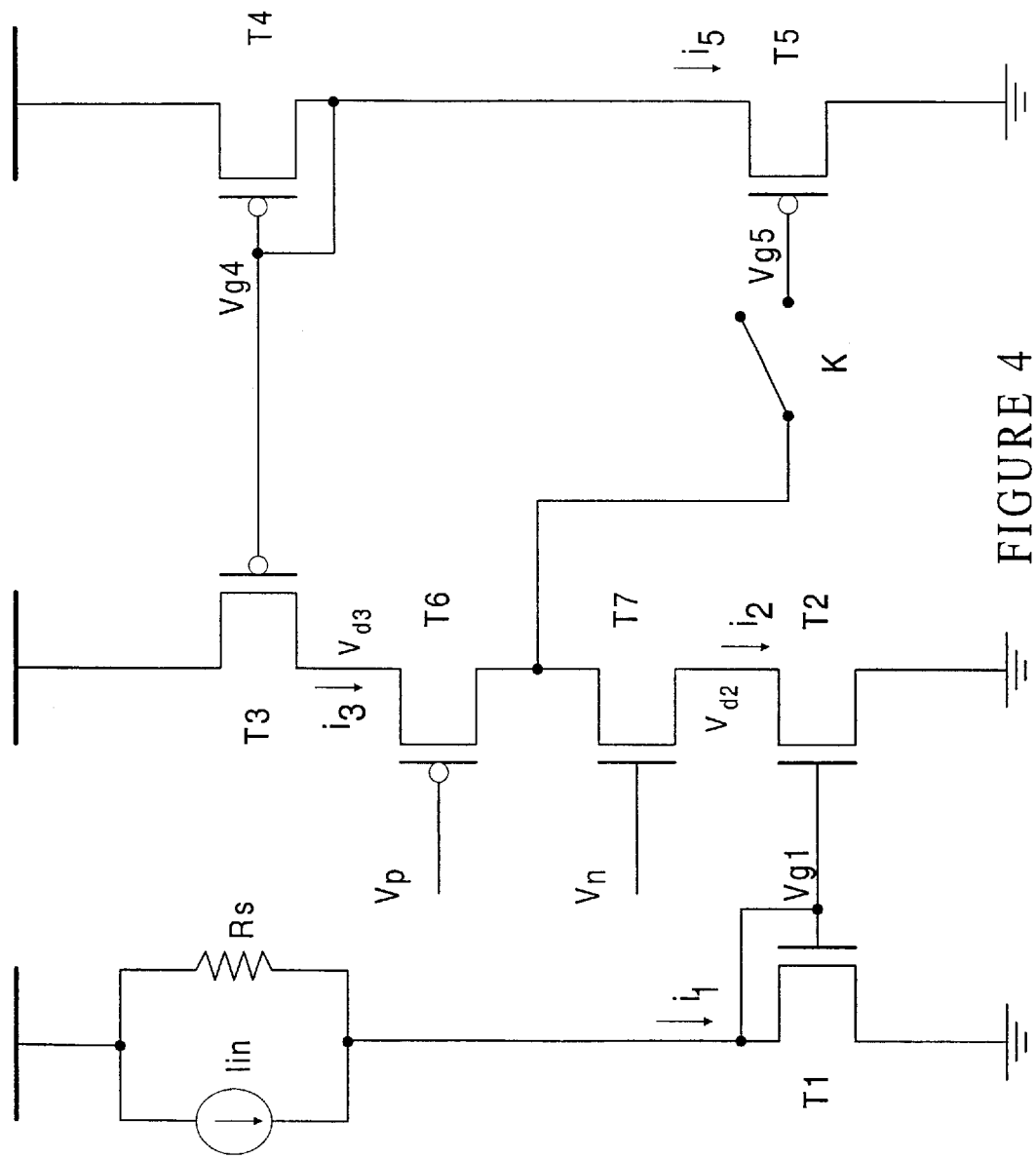
FIG. 4 is an electrical circuit schematic of another embodiment of the present invention wherein two extra transistors are added in order to change the width of the transition region of the transfer characteristic.

In another embodiment of the present invention, two extra transistors $T_6$ and $T_7$ may be added according to the embodiment illustrated in FIG. 4, in order to give more flexibility to the system. In fact, without $T_6$ and $T_7$, the minimum current difference $|i_{IN}-I_{TH}|$ required to switch from the output voltage $V_{OUT}$ from one value to the other is affected by the finite output resistance of the transistors $T_2$ and $T_3$. It is desirable to obtain a determined output voltage level even if the two currents are close to each other.

Figure 5:
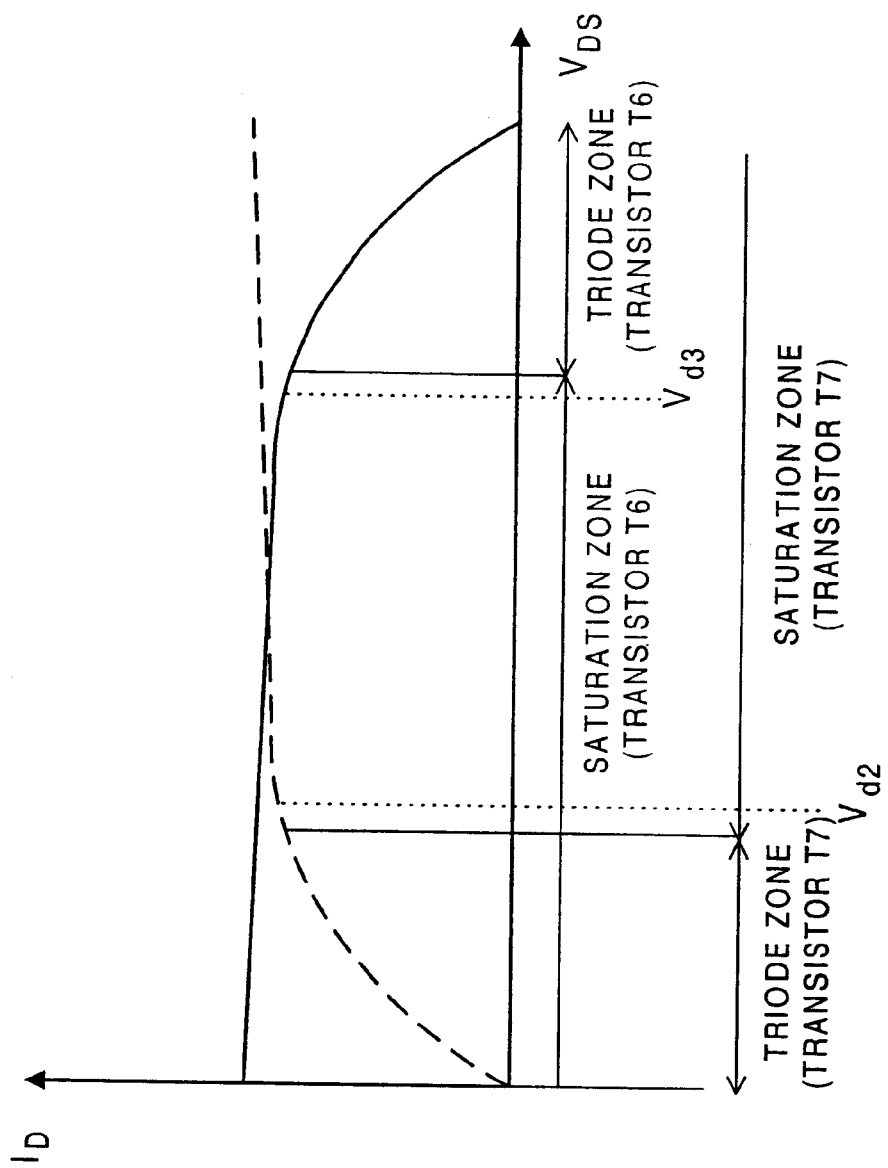
FIG. 5 is a graph which shows the drain current versus the drain-source voltage for transistors $T_6$ and $T_7$; because of the variation of the slope of the curve, a difference in the drain current may create various drain-source voltage difference depending on the location on the curve.

In the circuit shown in FIG. 4, two constant voltages $V_N$ and $V_P$ may be applied at the gate of transistors $T_6$ and $T_7$ in order to set the operating points $V_{D2}$ and $V_{D3}$ at the drains of transistors $T_2$ and $T_3$. If $T_6$ and $T_7$ set the operating points $V_{D2}$ and $V_{D3}$ of transistors $T_2$ and $T_3$ in the saturation region near the triode region, as shown in FIG. 5, a small difference $|i_{IN}-I_{TH}|$ may drive quickly one of the transistor in the triode region and the output voltage level will be determined; the transition zone between one output voltage and the other output voltage is narrower than when transistors $T_6$ and $T_7$ are not used. Transistors $T_6$ and $T_7$ by allow, by setting the operating points $V_{D2}$ and $V_{D3}$ at the drains of transistors $T_2$ and $T_3$, an accurate control of the width of the transition period between one output voltage and the other. For certain type of signal detection, this feature may be desirable.

When the switch K is turned from on to off, the charge injection effect may modify the established $V_{G3}$ and shift the equilibrium point. In one embodiment of the invention, shown in FIG. 4, a measure has been taken in order to reduce the effect of the charge injection. The charge injection occurs at the node $V_{G5}$, making a variation of $\Delta V_{G5}$, which is transferred to $V_{G3}$ with an attenuation coefficient, approximately equal to $1/(1+(gm_4/gm_5))$, wherein $gm_4$ and $gm_5$ are respectively the transconductance of transistors $T_4$ and $T_5$. By maximizing the ratio $gm_4/gm_5$, this effect may be avoided. Such maximization may be performed by changing the size of transistors $T_4$ and $T_5$. Moreover, certain measures, such as dummy switch charge cancellation (K. R. Stafford, R. A. Blanchard and P. R. Gray. "A completely monolithic sample/hold amplifier using compatible bipolar and silicon-gate FET devices," IEEE J. Solid-State Circuits, vol. SC-9, December 1974, pp381–387) may be taken in order to reduce $\Delta V_{G5}$, so that the critical node $V_{G3}$ is doubly protected.

Figure 6:
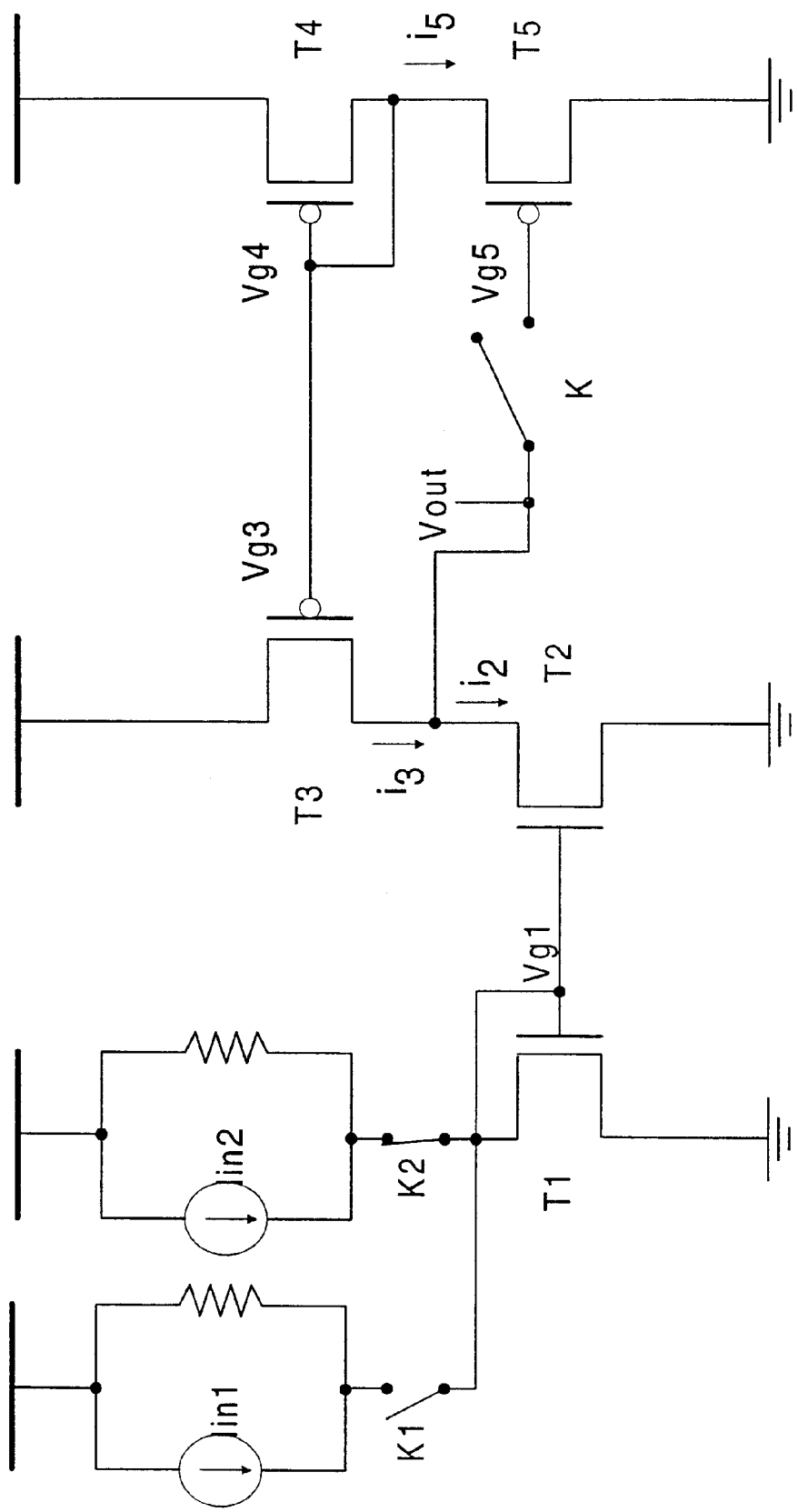
FIG. 6 is an electrical circuit schematic of another embodiment of the present invention wherein two current sources are used.

Now referring to FIG. 6, there is shown another embodiment of the present invention. In this embodiment of the present invention, a comparison between two currents is performed. Switches $K_1$ and $K_2$ allow the injection of either current $i_{IN1}$ or current $i_{IN2}$ inside the comparator. Switch K is used to select the current comparison reference, which may be either current $i_{IN1}$ or current $i_{IN2}$.

Figure 7A:
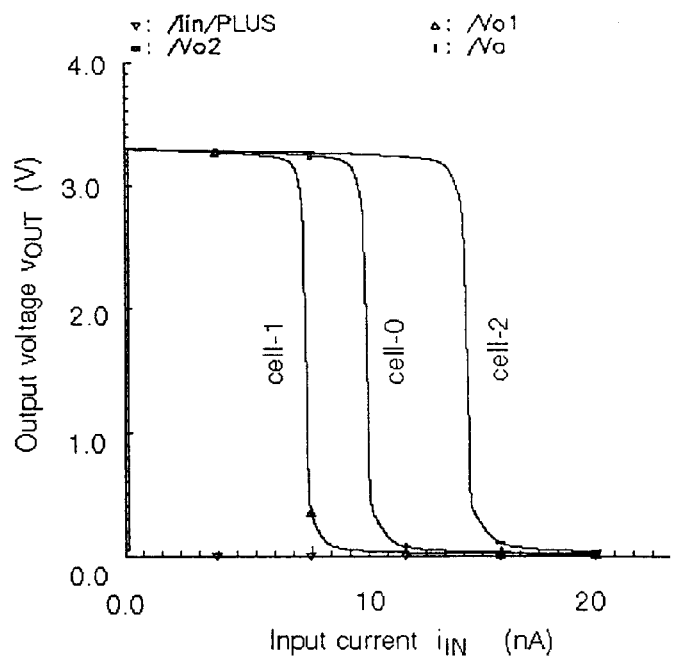
FIG. 7a is the result of a simulation which shows the output voltage versus the input current of the three apparatus which are designed identically and each of which converts a current signal into a two level voltage signal with a threshold non-identical to that of the others due to the non-identical physical parameters of the devices employed.

Now referring to FIG. 7a, there is shown the output voltage versus the input current of three apparatus, which are designed identically and each of which converts a current signal into a two level voltage signal with a threshold non-identical to that of the others due to the non-identical physical parameters of the devices employed. The simulation has been performed using HSPICE with the transistor models of a 0.35 μm CMOS technology. The switch K is replaced by two NMOS transistors, one of them being connected as a dummy switch to reduce the effect of charge injection. In order to evaluate the ability of the cells to have a uniform threshold across the entire comparator matrix, the sizes of the corresponding transistors in the cells are made different. For example, $T_3$ of cell 0 and $T_3$ of cell 1 have a geometric mismatch of more than 20%.

Figure 7B:
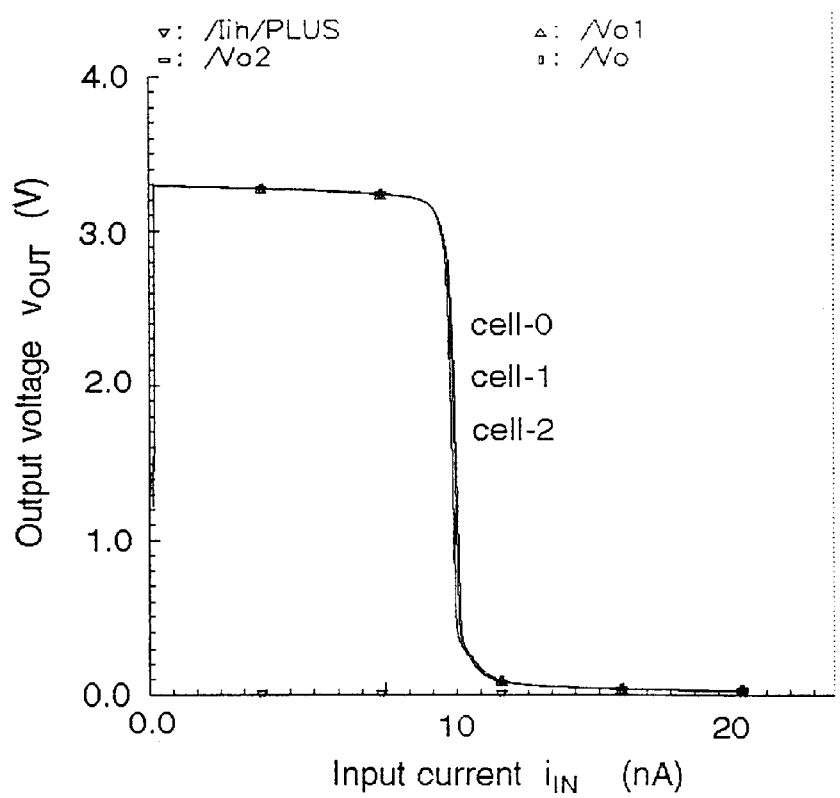
FIG. 7b is the result of a simulation which shows the output voltage versus the input current of the three apparatus which are designed identically and each of which converts a current signal into a two level voltage signal; this shows the results when using one embodiment of the present invention.

The simulation is performed in two steps. The first step, of which the results are illustrated in FIG. 7a is to test the transfer characteristics of the cells without any compensation. For this purpose, $T_4$ and $T_5$ are disconnected from the cells. By adjusting $V_{G3}$ of a cell, for example cell 0, a threshold current of 10 nA is set in this cell. The same $V_{G3}$ is then applied to all cells, Due to the size variation in the corresponding transistors of various cells, the threshold for comparison is very different from cell to cell. FIG. 7a shows the transfer characteristics of the output voltage $V_{OUT}$ versus the input current $i_{IN}$ of the three different cells. The variation in the threshold, $\Delta i_{TH}/i_{TH}$ is about 50%. The second step is to test the efficiency of the proposed compensation method by including $T_4$ and $T_5$ in the circuit as shown in FIG. 3. With an input current of 10 nA applied to all the cells, the threshold set-up process is performed. FIG. 7b shows the transfer characteristics of the same three cells obtained after the set-up process. The variation in the threshold $\Delta i_{TH}/i_{TH}$ of the cells is less than 1%.

In another embodiment of the present invention, PNP and NPN transistors may be used, with a current feedback in order to create the equilibrium.

What is claimed is:

1. A converter for converting an input current signal into a two-level output voltage signal depending on a threshold current signal value, said converter comprising;

a first circuit for converting said input current signal into said output voltage signal, said first circuit comprising an output transistor, said output transistor providing said output voltage signal, a voltage to current converter, said voltage to current converter receiving a controlled voltage and providing a feedback current signal to said output transistor of said first circuit, said feedback current signal entering said output transistor and modifying said output voltage signal to be equal to an intermediary voltage corresponding to a threshold current generating said controlled voltage signal during a set-up, a set-up switch receiving said output voltage signal and providing said controlled voltage signal, wherein said switch enables a setup of said threshold current signal value with a specific input current signal value when said transistor is closed.

2. The apparatus as claimed in claim 1, wherein said first circuit comprises a transistor current mirror, said transistor current mirror receiving said input current signal and providing a mirrored current signal to said transistor.

3. The apparatus as claimed in claim 1, wherein said voltage to current converter comprises a transistor.

4. The apparatus as claimed in claim 3, wherein said voltage to current converter comprises said transistor for converting said controlled voltage signal into an interstage feedback current signal, and a transistor current mirror for mirroring said interstage feedback current signal into said feedback signal.

5. The apparatus as claimed in claim 1, wherein the output transistor is maintained in a certain mode, said certain mode enabling a modification of the sensitivity of said apparatus.

6. The apparatus as claimed in claim 4, wherein the transistor, of said transistor current mirror, which provides said transistor mirrored current signal is maintained in a certain mode of operation said certain mode of operation enabling a modification of the sensitivity of said apparatus.

7. The apparatus as claimed in claim 5, wherein said transistor is maintained in a certain mode using a transistor.

8. The apparatus as claimed in claim 6, wherein said transistor is maintained in a certain mode of operation using a transistor.

9. The apparatus as claimed in claim 1, wherein said first circuit, said voltage to current converter and said set-up switch are integrated on the same substrate.

10. A method for converting an input current signal into a two-level output voltage signal depending on a threshold current signal value and using a transistor, said method comprising the steps of:

receiving said threshold current signal value;

memorizing said threshold value by setting up said transistor in a configuration wherein said output voltage has a certain value;

receiving said input current signal to be compared to said threshold current signal value;

comparing said input current signal to said threshold current signal value;

outputting a two-level output voltage signal depending on said input current signal value and said threshold current signal value.

11. A method for comparing a first input current signal to a second input current signal and outputting a two-level output voltage signal, using a transistor, said method comprising the steps of:

receiving said second input current signal;

memorizing said second input current signal as a threshold value by setting up said transistor in a configuration wherein said output voltage has a certain value;

receiving said first input current to be compared to said threshold value;

comparing said first input current to said threshold value, outputting a two-level output voltage signal depending on said first input current and said threshold value.

12. The method as claimed in claim 11, wherein said second input current signal is selected by closing a second switch and opening a first switch and wherein said first input current signal is received by closing said first switch and opening said second switch.

* * * * *